United States Patent [19]

Gasiunas

[11] Patent Number: 4,893,121

[45] Date of Patent: Jan. 9, 1990

[54] PRINTWHEEL AND ENCODER ASSEMBLY

[75] Inventor: Donatas V. Gasiunas, Carmel, N.Y.

[73] Assignee: Pitney Bowes Inc., Stamford, Conn.

[21] Appl. No.: 136,076

[22] Filed: Dec. 21, 1987

[51] Int. Cl.[4] .............................................. H03M 1/22

[52] U.S. Cl. ....................................... 341/15; 341/133; 341/171; 310/DIG. 3; 364/900; 364/918.52

[58] Field of Search ....... 340/347 P, 347 AD, 347 M; 250/231 SE; 310/168, 154, DIG. 3; 341/126, 133, 136, 141, 171, 172; 364/900; 101/91

[56] References Cited

U.S. PATENT DOCUMENTS 3,112,464 11/1963 Ratajski et al. .......... 310/DIG. 3 X 3,939,372 2/1976 Wurst et al. ........................ 310/168

4,168,533 9/1979 Schwartz ............................ 364/900

4,427,969 1/1984 Coppola et al. ......... 340/347 CC X

*Primary Examiner*—William M. Shoop, Jr.
*Assistant Examiner*—Brian K. Young
*Attorney, Agent, or Firm*—Michael J. DeSha; David E. Pitchenik; Melvin J. Scolnick

[57] ABSTRACT

A printwheel encoder comprises a non-ferrous shaft having a magnet strip and a flexible Hall-effect sensor arrangement affixed thereon. Molded printwheels including a flux conducting ring having an inner spiral surface are rotatably mounted on the shaft in respective juxtaposition to each Hall-effect sensor. The wheels are mounted adjacent to each other so that the rings form a nearly continuous flux conducting sheath which protects the Hall-effect sensors from external magnetic fields.

4 Claims, 8 Drawing Sheets

FIG.3
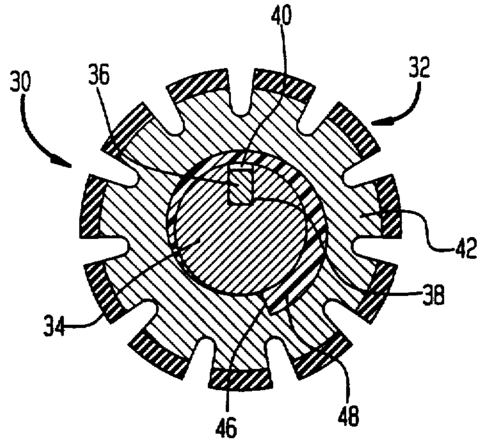
FIG.4
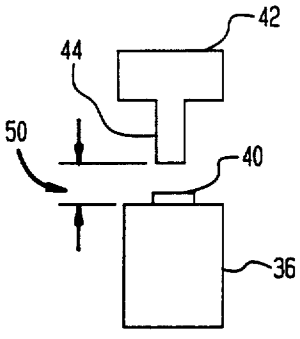
FIG.5
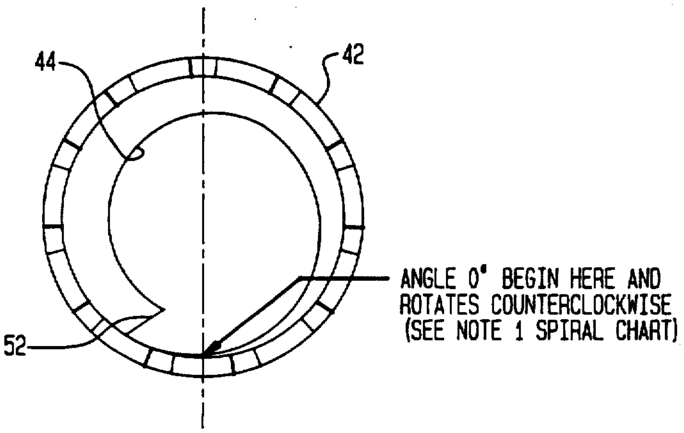
FIG.6
| SPIRAL CHART | |
|---|---|
| RADIUS | ANGLE |
| 0.196 | 0.00 |
| 0.187 | 32.73 |
| 0.180 | 65.46 |
| 0.172 | 98.19 |
| 0.166 | 130.92 |
| 0.160 | 163.65 |
| 0.154 | 196.38 |
| 0.149 | 229.11 |
| 0.144 | 261.84 |
| 0.139 | 294.57 |
| 0.135 | 327.30 |

PRINTWHEEL AND ENCODER ASSEMBLY

BACKGROUND OF THE INVENTION

The invention relates to encoder devices and more particularly to devices for providing signal outputs representing the position of a printwheel.

Printwheel encoders are well-known and are described, for example, in U.S. Pat. No. 3,978,457 and in 4,313,105 in connection with postage meter printwheels. Because of the great need for security in devices such as postage meters which in effect are printing money, many of the known encoder devices which provide mechanical switching contact rising wipers are normally not sufficiently rugged to reach the number of cycles anticipated for the meter. In addition, the environment of postage meters, involving as it does paper dust and envelope glue and water, militates against such mechanical devices because of the expense of the necessary protection against the environmental factors.

In order to avoid this aspect of the environmental problems and to achieve greater life expectancy, optical encoders have been used in various ways in postage meters. While optical encoders work well, there are many cases in which the requirement for encoding necessitates an increased volume of the setting mechanism for the printwheels simply because of the extra space necessary to accommodate the encoder and an encoding disc.

Hall-effect sensors have also been used in postage meters. Magnets have been mounted on the setting rack and the magnetic position is sensed to aid in determining the position of the rack driving a printwheel as shown in U.S. Pat. No. 4,398,458. Magneto-restrictive sensors are shown in U.S. Pat. No. 4,224,603. This last cited patent teaches apparatus which requires that the print drum and its racks be in motion in order to determine the setting of the printwheels.

Hall-effect sensors have also been used to generate position-dependent pulses for synchronization. Such an application is shown in U.S. Pat. No. 3,939,372 in which a flux-conducting cam is brought near the sensor as a shaft rotates in order to generate a signal pulse from the sensor suggested therein is a spiral shaped magnet which in conjunction with the Hall-effect device may be used to provide position information.

In postage meter printwheel setting mechanisms, where each of the printwheels must normally be handled as an individual unit there is a need to provide encoding in a small volume and to provide an encoding arrangement which may be easily assembled with respect to the printwheel optical encoders.

It is therefore an object of the invention to provide an encoder assembly which solves the problem of mounting and providing encoding of a plurality of printwheels in a relatively dirty environment and in a small volume.

It is another object to provide an assembly of printwheels including position encoding apparatus within the printwheel space.

It is yet another object to provide an absolute position encoder assembly including printwheels which provides security against negative disturbances.

SUMMARY OF THE INVENTION

In an embodiment of the encoder and printwheel assembly in accordance with the invention, a plurality of postage meter printwheels are mounted on a nonferrous shaft having a magnet fixed along the length of a slot in the shaft. The printwheels each have a ring of flux-conducting material whose internal surface forms a spiral about the shaft. A plurality of Hall-effect devices are mounted in a flexible ribbon carrying the sensor leads and fixed on the shaft between the magnet and the flux-conducting ring of each respective printwheel. The Hall-effect device in conjunction with the variable reluctance path provided by the spiral inner surface of the flux-conducting ring as the distance between the magnet and the flux-conducting material varies provides an output signal which varies with the angular position of the printwheel.

The output of each Hall-effect device is multiplexed and transmitted to an A/D converter whose digital output is then communicated to a microcomputer for providing printwheel-position-determining information to the microcomputer.

In a further embodiment, another Hall-effect device is mounted on the shaft on the opposite side from the magnet for the purpose of measuring the return flux. The output from this second Hall-effect sensor may be used to supplement the output from the first Hall-effect device to provide greater accuracy if required for the largest gap widths. A sum of the two values also provides information on the total magnetic field; unacceptable variation in total flux would indicate attempts to tamper.

BRIEF DESCRIPTION OF THE DRAWINGS

FIG. 3 is a cross-section of a printwheel showing an encoding arrangement in accordance with the invention.

FIG. 4 shows a schematic end view of the relationship of the magnet, sensor, and concentrator.

FIG. 5 is a side view of the flux-conducting ring.

FIG. 6 is a table of the radii of the spiral surface vs. angle of the printwheel.

DESCRIPTION OF THE PREFERRED EMBODIMENT

Figure 1:
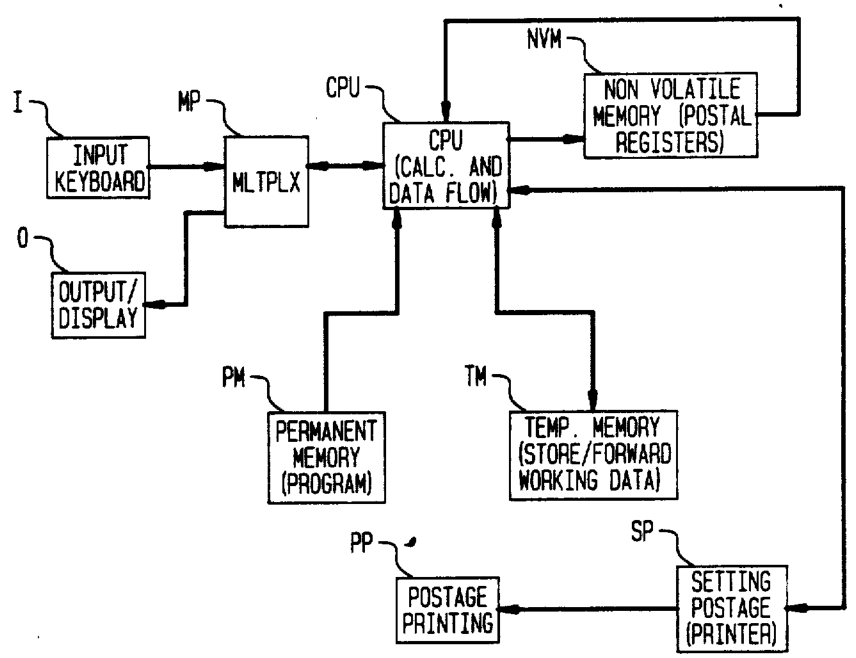
FIG. 1 is a block diagram of an electronic postage meter incorporating an encoder in accordance with the invention.

FIG. 1 is a block diagram of an electronic postage meter incorporating an encoder arrangement in accordance with the invention. Typical postage meter systems in which an encoder in accordance with the invention may be used are disclosed for instance in U.S. Pat. No. 3,978,457 issued to Check, Jr. specifically incorporated herein by reference and U.S. Pat. No. 4,301,507 issued to Soderberg, et al., also specifically incorporated by reference herein.

Referring now to FIG. 1, an electronic postage meter is shown which operates under the control of a central processing unit (CPU). The CPU accepts input data regarding postage to be printed and the like from an input keyboard I or from a peripheral device as described in U.S. Pat. No. 4,301,507 previously incorporated by reference. As seen in FIG. 1, the input data may be received at a multiplexer MP which conveniently serves as well to provide output data to output display device labeled "O".

The CPU performs calculations on the input data and provides control of the meter operation directed by a computer program which resides in permanent memory PM. Accounting data is transferred to non-volatile memory either on a transaction-by-transaction basis as described for instance in U.S. Pat. No. 4,484,307 or may be transferred after calculations performed in temporary memory TM and then transferred to non-volatile memory, again either on a transaction-by-transaction basis or at the end of a particular batch of operations or at the end of a run on power-down as described in U.S. Pat. No. 3,978,457.

In accordance with input data to the CPU and under control of the program, the CPU provides information for the setting of printwheels through a setting mechanism SP to the postage printer shown at PP. The position of each bank of printwheels is monitored by an encoder device to provide data to the CPU to assure that the printwheels are positioned to the expected setting in accordance with the invention provided by the setting mechanism SP. Encoder information is sent to the CPU for comparison to the expected setting.

While the instant invention is shown in conjunction with value printing wheels, it will be understood that the encoder embodiment shown herein may be utilized in conjunction with other printing wheels such as those used for printing dates or identification numbers or the like. It will also be appreciated that the invention illustrated and described in the instant embodiment for angular rotation may be adapted to linear relative movement as well.

Figure 2:
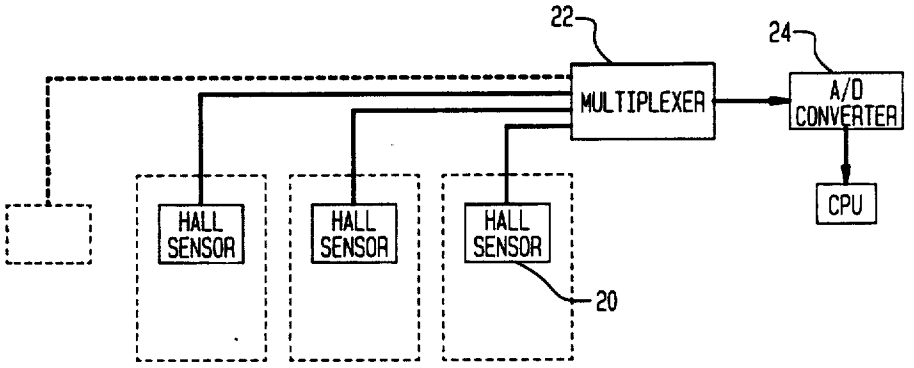
FIG. 2 is a block diagram of the encoder system in accordance with the invention.

FIG. 2 shows a block diagram of the encoding apparatus in accordance with the invention. Linear Hall-effect devices 20 mounted in juxtaposition to printwheels (indicated in broken lines) provide, as described below, respective outputs corresponding to the position of each of the printwheels to a multiplexing device 22 which communicates with A/D converter 24 for output of digital position signals representing to the CPU the actual position of the printwheels in printing device PP of FIG. 1.

A suitable analog multiplexer device is available from National Semiconductor, device No. CD4053, and a suitable A-to-D converter for use in accordance with the invention is available from Analog Devices, as No. AD7574.

FIG. 3 shows a cross-section of a printwheel which includes an encoder device in accordance with the invention. The printwheel 30 has a plurality of print elements, one of which is indicated at 32, regularly spaced and bonded to projections about its periphery. In the illustrated embodiment there are 11 elements, but it will be understood that, if desired, there may be fewer or more up to the limit dictated by size of printing elements.

The printwheel 30 is shown rotatably mounted on a shaft 34. The shaft must be fabricated from a non-ferrous material which may be chosen from aluminum, brass, plastic or other non-magnetic materials which are well known in the art. Magnet 36 is held in slot 38 of the shaft. Hall-effect linear sensor 40, suitably Hall-effect device No. XL3503 manufactured by Sprague, is shown affixed over slot 38 above the magnet 36. Suitable magnets are available from Indiana General.

Within the periphery of the printwheel 30, as best seen in FIG. 5, is a ring 42 of flux-conducting material, preferably a mild steel. The inner surface of the ring projects inwardly in a spiral configuration or spiral scroll 44 of increasing distance from the periphery of the shaft with a step return to the closest point indicated at 46. It will be appreciated that the projections about the periphery for the printing elements may be molded over the ring shown in FIG. 5 or may be manufactured as part of the ring 42. A molded plastic inner bearing surface 48 completes the printwheel. Printwheels are also illustrated in perspective in the assembly shown in FIG. 13.

FIG. 4 illustrates in schematic form the relationship between the magnet 36, the Hall-effect sensor 40, and the flux-conducting scroll or concentrator 44. It will be understood that the gap dimension, indicated at 50, between the spiral surface of the flux-concentrating material 44 and the Hall-effect sensor 40 depends upon the angular position of the printwheel with respect to the Hall-effect sensor. Since the output of the linear Hall-effect sensor 40 depends on the dimension of the gap between the flux-concentrating material and the sensor, the output from the sensor 40 will correspond to the actual gap width between the flux concentrating material directly opposite the sensor and the Hall-effect sensor. Thus the actual magnitude of the output relative to the lowest or highest output will be in determinable correspondence to the angular position of the printwheel 30 in respect to the Hall-effect sensor 40.

Figure 13:
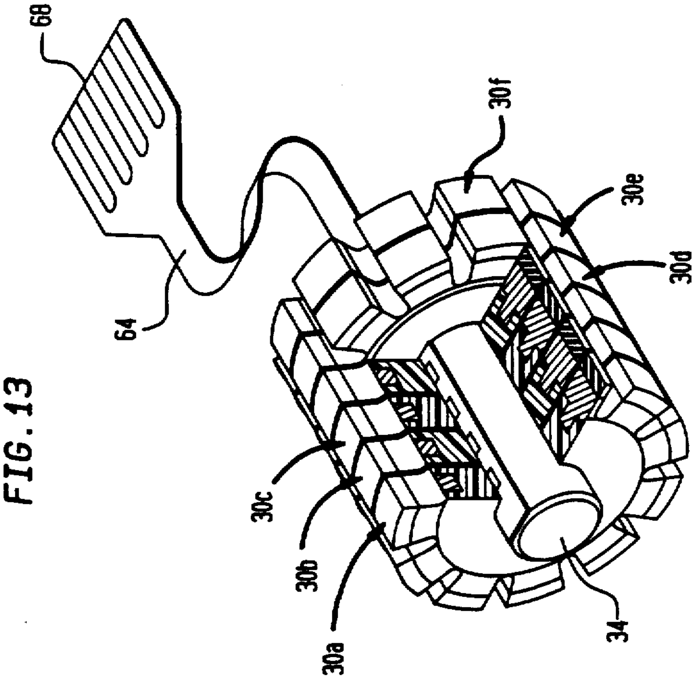
FIG. 13 is a perspective view of a printwheel assembly incorporating an encoding arrangement in accordance with the invention.

As seen in FIG. 4, the cross-section of the spiral scroll is a T-shape. For single wheels, the width of the spiral scroll is less important than for assemblies of closely adjacent wheels where there is the possibility of cross coupling of magnetic flux among the scrolls. However, it will be appreciated that there is a minimum amount of material which is necessary to provide suitable flux concentration. The optimum thickness of the scroll portion has been found to be about 0.030 inch for a configuration as seen in FIG. 13. It will be understood that as separation between adjacent printwheels increases, the thickness of the scroll portion can increase.

FIG. 5 shows the preferred configuration for the scroll surface 44. While a circular spiral or other changing surfaces may be used, it is preferable that the surface is configured as a hyperbolic spiral to linearize the output of the Hall-effect sensor. For best results, the step between high and low points is undercut as shown at 52 to provide a sharp transition between the lowest and highest outputs from the Hall-effect sensor. FIG. 6 is a table showing the radius to the spiral surface at each step angle of the printwheel.

Figure 7:
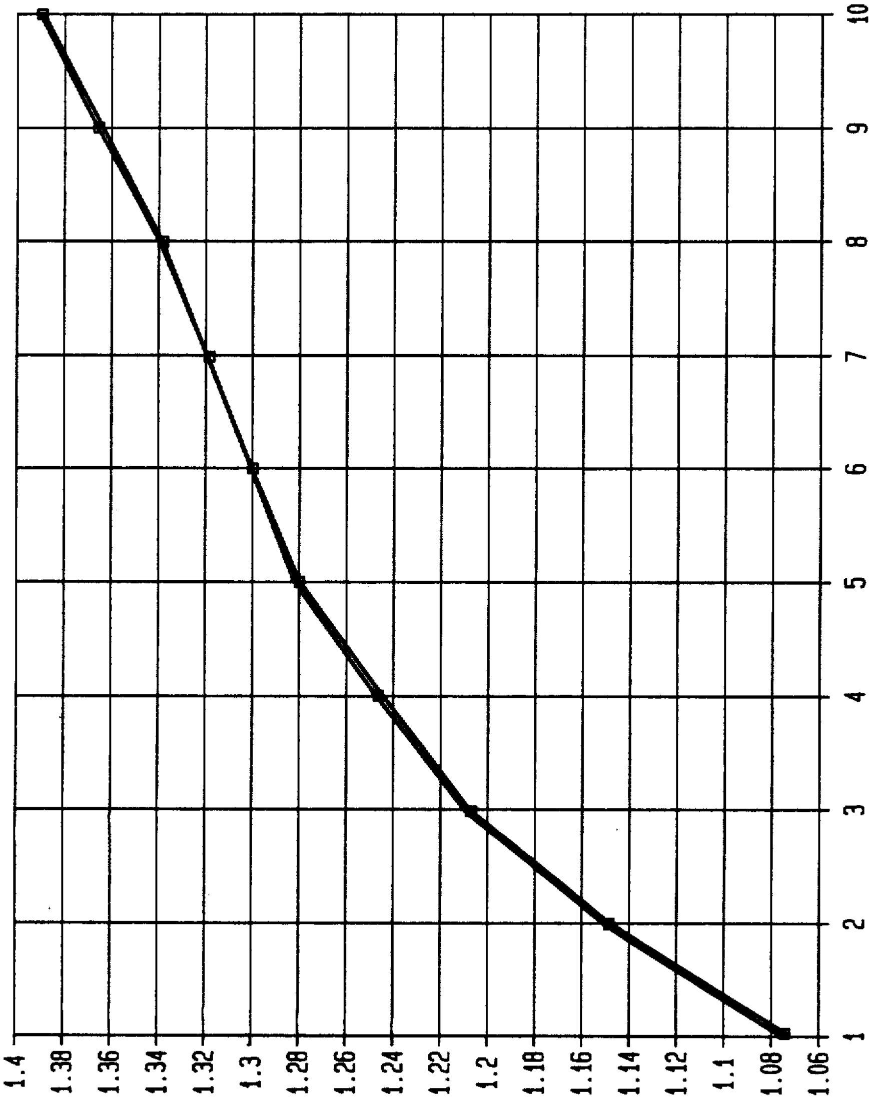
FIG. 7 is a graph of a typical output voltage-position of Hall-effect encoder apparatus of construction similar to the printwheel illustrated in FIG. 3.

FIG. 7 is a graph of output of voltage with respect to position measured in a test fixture. The necessary resolution in the A/D converter for determining the actual position of the wheel depends only upon the accuracy required. For the case of printwheels which have determined discrete angular position settings, there is only the requirement that the printwheel be within a certain range of output values and the required resolution for absolute encoding is relatively low.

It will also be noted that the step between the highest to the lowest output as the wheel turns provides a clear indication of the "home" position. All values may be then measured with respect to the output at this transition point in order to determine the range of output at each printwheel setting.

Figure 8:
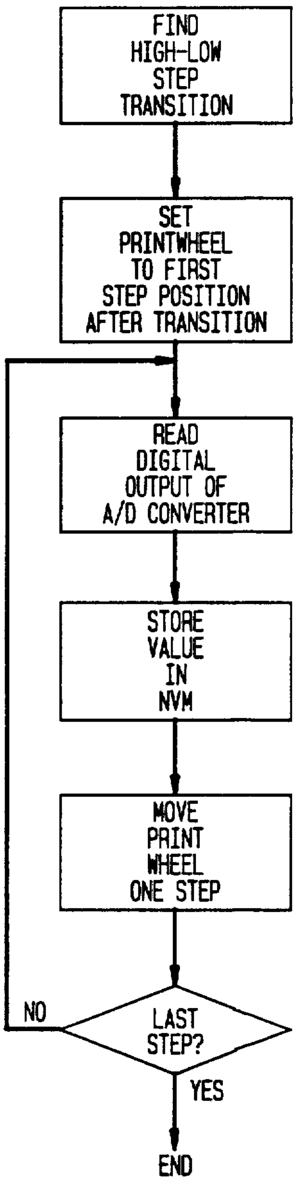
FIG. 8 is a flow chart illustrating the determination of values for absolute encoding of the printwheel.

FIG. 8 shows a routine for inserting into non-volatile memory measured values of the output of the A-D converter corresponding to the position steps of the printwheel. The transition from high to low is noted and the first position thereafter is measured as the output of position 1. The output is read and the value is stored in non-volatile memory. The printwheel is moved one step and the new value read and stored until all values have been read and stored.

It will be appreciated that the measurements thus made and stored eliminate any need for precision tolerances in the construction of the printwheel and encoder. The wheel structure is fabricated and mounted on the shaft, the initial measurements are made and the value stored, and thereafter the output of the Hall-effect sensor is compared with the stored value for determining the absolute position of the printwheel.

Figure 9:
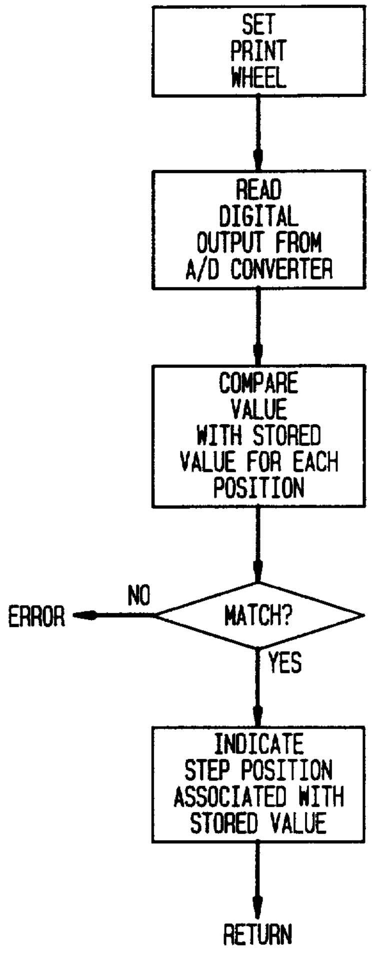
FIG. 9 is a flow chart of the routine for using the encoder values, in setting of postage printwheels.

FIG. 9 shows a routine for operation of the encoder, for example, in the setting of printwheels for postal value. Under command of the CPU, the printwheels are moved to a new desired position. The output of the A-to-D converter corresponding to the output analog signal from the printwheel Hall-effect sensor is read and compared to the known values stored in the non-volatile memory. If there is no match an error is signalled. If there is a match, the particular position is indicated and the CPU returns to operate on the next printwheel or to the main program.

Of continuing concern in analog devices is variation in analog output over time or with changes in configuration. In the instant embodiment, it will be appreciated that the measurement of output signal of the Hall-effect device versus angular position of the printwheel which is measured initially to establish the range of output at each setting and is stored in the non-volatile memory is always available for comparison at predetermined times or as desired during service checks to determine if correction is necessary.

The output of the Hall-effect device may be communicated directly to the A to D converter if only a single output is required, but preferably, where multiple printwheels are to be encoded the output is multiplexed from any additional sensors through the multiplexing device 22 as shown in FIG. 2 so that the output of each Hall-effect sensor for each printwheel is fed to the A-to-D converter for providing digital position information on each printwheel to the CU.

It will be appreciated that in providing the encoder mechanism in accordance with the invention, the spiral scroll surface is not limited to being placed as indicated, i.e., the inside surface of the ring in the printwheel. The Hall-effect device and magnet could be placed outside the boundaries of the printwheel so that the magnet is on the outside and the scroll is the outer periphery of the ring placed about the shaft in juxtaposition to the magnet. It will also be appreciated that the magnet and Hall-effect sensor could be placed perpendicularly to the printwheel and the flux-conducting material be arranged such that the spiral surface and therefore the gap dimension is increasing parallel to the axis rather than perpendicular to the axis as in the embodiment shown.

It should be further noted, however, that the embodiment illustrated is the most compact arrangement of those described. It also has the further advantage that any stray magnetic fields are effectively blocked by the mild steel scroll material so as to prevent any external environmental stray magnetic fields from affecting the printwheel setting indicator or to thwart any attempts to breach the security of the meter by preventing reading of proper values at the Hall-effect sensor.

It will also be appreciated that the invention is not limited to the circular arrangement shown and that any two members having relative displacements may be encoded by arrangement of the flux concentrating material such that displacement of the members increases and decreases the gap between the flux concentrator and the Hall-effect sensor.

Figure 10:
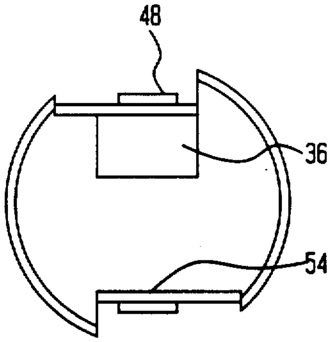
FIG. 10 shows another embodiment of a printwheel and shaft using an additional Hall-effect sensor for compensation.

FIG. 10 is another embodiment of a printwheel encoder in accordance with the invention. In this embodiment, another Hall-effect device 54 is fixed on the periphery of shaft 34 opposite Hall-effect device 40 to measure the return flux to the magnet 36.

The output signal available from this Hall sensor 54 will vary in respect of distance between it and the scroll in the same manner as the varying output of device 40. The step changes in flux tend to decrease as the gap between scroll 44 and the Hall-effect sensor 40 widens. The change in flux at Hall-effect device 54 will provide measurable changes in the return flux which may be used to increase the signal available from the sensor 40.

It will be appreciated that the total flux through the two sensors will normally remain constant. Thus, if for some reason, the value of the sum of the outputs from the two signals were to change from a previously determined sum, there is an indication of tampering.

Figure 11:
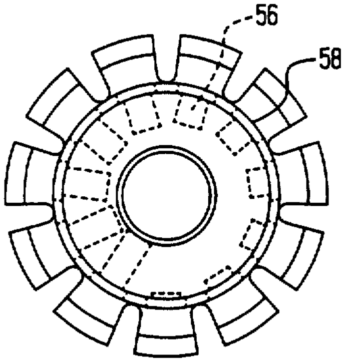
FIG. 11 shows an alternate embodiment of a printwheel encoder arrangement.

FIG. 11 shows an alternative embodiment of the printwheel. The construction of the printwheel is the same as previously described except that in place of the continuous spiral shown in FIG. 3, a plurality of mild steel teeth respectively located at each printwheel step, one of which is indicated at 56, and each being of depth preferably corresponding to the spiral surface shown in FIG. 3, project inwardly from ring 58. It will be understood that as the slots are positioned over the Hall-effect sensor 40, the output of the sensor 40 drops. The slots between the teeth 56 thus serve to assure that the printwheel has reached the exact position step when it reaches the maximum value for the particular position step since the output between adjacent teeth falls to a minimum.

Figure 12:
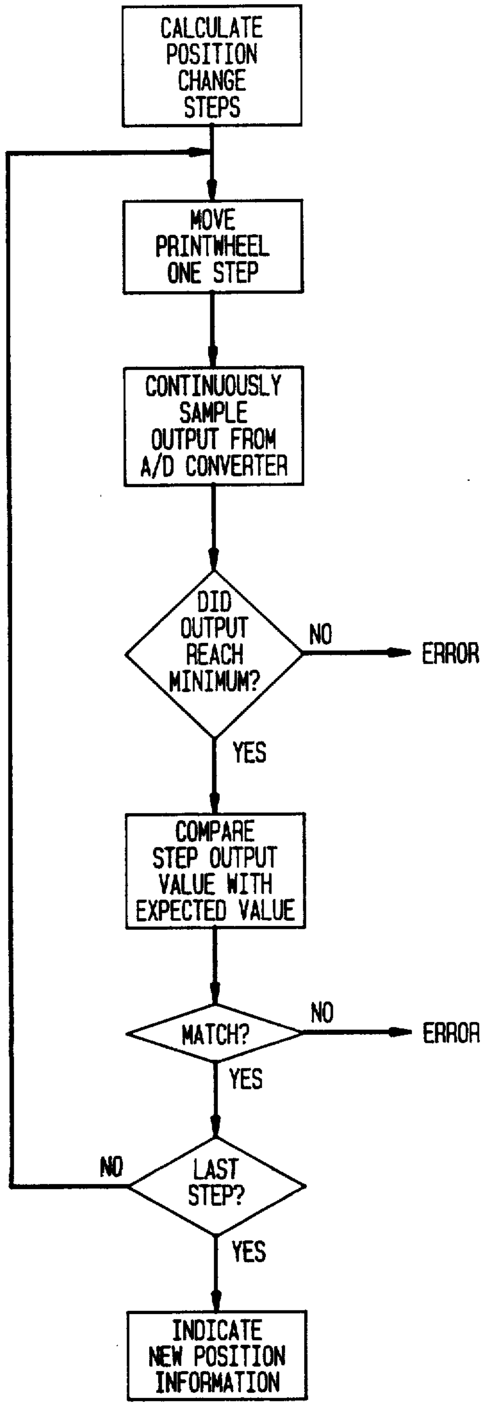
FIG. 12 is a flow chart illustrating a routine for encoding utilizing the embodiment of FIG. 11.

Further with continuous monitoring of the output of Hall-effect device, redundant position information may be obtained by counting the number of slots passed during the movement of the wheel from the initial position to the new position. FIG. 12 is a routine for utilizing the encoding of the printwheel of FIG. 11.

Figure 14:
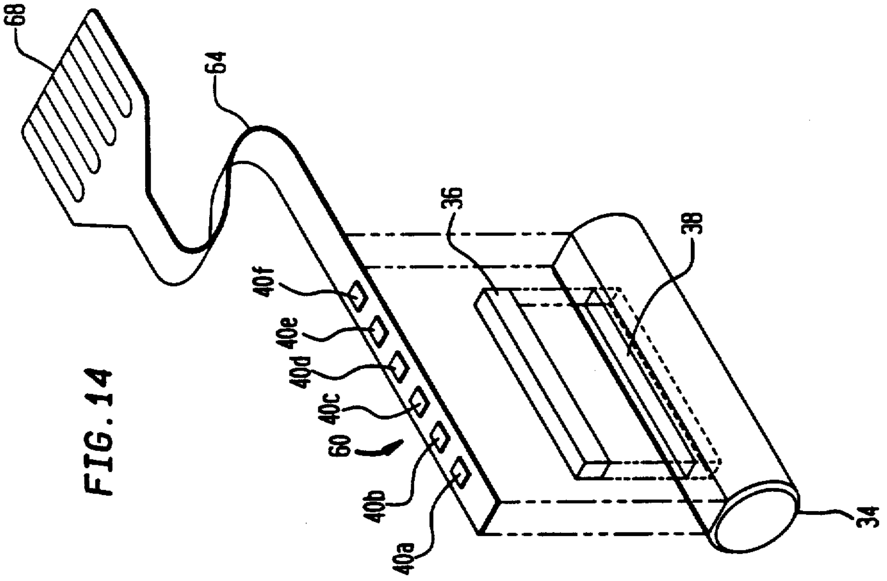
FIG. 14 is an exploded perspective view further illustrating the printwheel shaft and Hall-effect devices shown in FIG. 12.

Turning now to FIGS. 13 and 14, there is shown a perspective view of a printwheel assembly incorporating an encoding arrangement in accordance with the invention. Shaft 34, which may be made of injection molded plastic or machined from aluminum or brass as previously discussed in connection with FIG. 3, has a longitudinally extending slot 38 into which is inserted and fastened permanent magnet strip 36.

Figure 16:
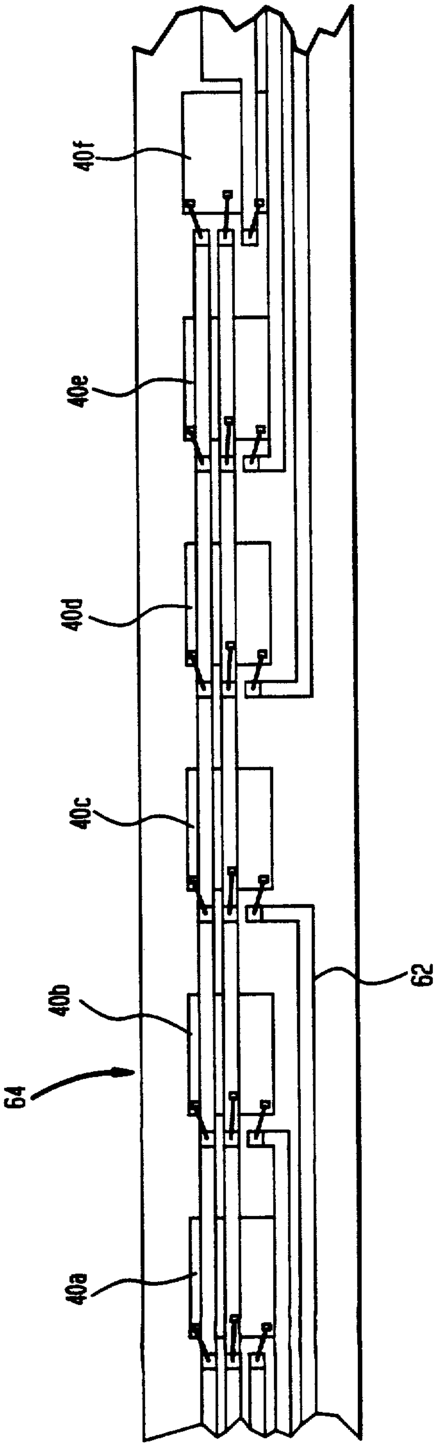
FIG. 16 is a top view of the flexible PC board for mounting the Hall-effect sensors in the flexible sensor assembly.

Flexible Hall-effect sensor assembly 60 includes spaced linear Hall-effect sensors 40*a* through 40*f* such as the aforementioned device manufactured by Sprague, bonded by gold-welding to leads (62) on a so-called flexible printed circuit board 64 shown in FIG. 16 which terminates preferably in ribbon connector 68. For best results, the shaft is encapsulated to protect and secure the Hall-effect sensors and to provide a continuous bearing surface for the assembled printwheels. It will be appreciated that where injection molded plastics are used, the sensor assembly 60 and magnet 36 may be simply embedded in the injection molded plastic forming the shaft. In the case of a machined or previously molded shaft, the entire unit can be encapsulated using conventional epoxy-type encapsulants.

Individual printwheels of the type described in conjunction with FIGS. 3, 5, 10, or 11 are molded to include a bearing surface for rotation about the shaft. The individual printwheels 30*a*, 30*b*, 30*c*, 30*d*, 30*e*, 30*f*, are mounted for rotation on the shaft. Preferably the wheels are simply mounted adjacent each other and held in place in juxtaposition to the corresponding Hall-effect sensors suitably by a flange, for example, at one end (not shown) and a clip retainer (not shown) at the other.

The individual printwheels may be driven by a picker mechanism as described for example in Application Ser. No. 07/136,084 entitled POSTAGE PRINTWHEEL SELECTOR APPARATUS filed on even date herewith. Other suitable mechanisms for driving the printwheels include the use of gears affixed to the printwheels for driving by racks or gear trains will occur to those skilled in the art and will not be further described.

It will also be understood that each printwheel may be mounted individually for rotation about its own corresponding shaft and that the Hall-effect sensor may be individually mounted if desired.

Figure 15:
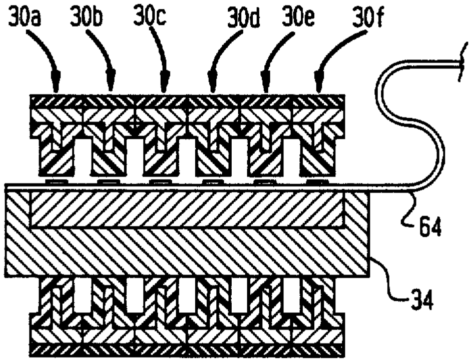
FIG. 15 is a cross-section of the printwheel assembly viewed from the side.

FIG. 15 is a cross-section of the printwheel assembly viewed from the side. It will be noted in this view that rings 42*a* through 42*f* when spaced this closely provide a nearly continuous flux-conducting sheath around the shaft. The advantage of this arrangement is that the Hall-effect devices on the shaft are protected from extraneous magnetic fields which are absorbed by sheath and therefore do can not contribute to the flux through the sensor.

This application incorporates certain material common to other applications identified as follows:

Ser. No. 07/135,793 entitled HALL EFFECT ENCODER APPARATUS and Ser. No. 07/136,085 entitled HALL EFFECT PRINTWHEEL ENCODER.

What is claimed is:

1. A printwheel assembly comprising:
- a shaft of non-ferrous material having a slot arranged along the length thereof;
- a magnet disposed in said slot;
- a plurality of Hall-effect sensors mounted in spaced relation along and juxtaposed to said magnet, each Hall-effect device having leads therefrom;
- a plurality of printwheels, each printwheel having a ring of ferrous material molded therein, said ring of ferrous material having a T-shaped cross section, said printwheels being mounted for rotation on said shaft and being located along said shaft in juxtaposition to respective Hall-effect devices on said shaft whereby an output signal on respective leads from each said Hall-effect device will vary in correspondence to the angular position of the respective printwheel; and
- means mounted on said shaft and extending therefrom for conducting said signals on said leads outside of said assembly.

2. The printwheel assembly of claim 1 further comprising multiplexing means connected for receiving said signals on said leads, said multiplexing means being connected to an A/D converter for providing a digital output.

3. The printwheel assembly of claim 1 wherein said printwheels are mounted on said shaft in close proximity to one another and wherein said rings provides a substantially continuous ferrous sheath about the shaft.

4. A printwheel encoder assembly comprising:
- a shaft of non-ferrous material having a slot arranged along the length thereof;
- a magnet disposed in said slot;
- a plurality of Hall-effect sensors mounts in spaced relation along and juxtaposed to said magnet, each Hall-effect device having leads therefrom;
- a plurality of printwheels mounted for rotation on said shaft, each printwheel having a ring of ferrous material of T-shaped cross section therein, said printwheels being mounted in close proximity such that said rings provide a substantially continuous ferrous sheath about the shaft.

* * * * *